US011018279B2

(12) United States Patent
Lee et al.

(10) Patent No.: US 11,018,279 B2
(45) Date of Patent: May 25, 2021

(54) LIGHT EMITTING ELEMENT HAVING EXCELLENT CONTACT BETWEEN SEMICONDUCTOR LAYER AND ELECTRODE

(71) Applicant: LG INNOTEK CO., LTD., Seoul (KR)

(72) Inventors: Yong Gyeong Lee, Seoul (KR); Min Sung Kim, Seoul (KR); Su Ik Park, Seoul (KR); Youn Joon Sung, Seoul (KR); Kwang Yong Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/444,528

(22) Filed: Jun. 18, 2019

(65) Prior Publication Data

US 2019/0305184 A1 Oct. 3, 2019

Related U.S. Application Data

(63) Continuation of application No. 15/749,730, filed as application No. PCT/KR2016/008325 on Jul. 29, 2016, now Pat. No. 10,763,394.

(30) Foreign Application Priority Data

Aug. 24, 2015 (KR) ........................ 10-2015-0118801

(51) Int. Cl.
*H01L 33/20* (2010.01)
*H01L 33/38* (2010.01)
(Continued)

(52) U.S. Cl.
CPC .............. *H01L 33/20* (2013.01); *H01L 33/38* (2013.01); *H01L 33/405* (2013.01); *H01L 33/08* (2013.01);
(Continued)

(58) Field of Classification Search
CPC ....... H01L 33/20; H01L 33/405; H01L 33/38; H01L 2933/0016; H01L 33/382;
(Continued)

(56) References Cited

U.S. PATENT DOCUMENTS 6,552,367 B1 4/2003 Hsieh et al.
7,485,897 B2 2/2009 Seong et al.
(Continued)

FOREIGN PATENT DOCUMENTS

JP 2001-244505 A 9/2001
JP 2010-232364 A 10/2010
(Continued)

OTHER PUBLICATIONS

U.S. Appl. No. 15/749,730, filed Feb. 1, 2018.
(Continued)

*Primary Examiner* — Mohammad M Hoque
(74) *Attorney, Agent, or Firm* — Birch, Stewart, Kolasch & Birch, LLP

(57) ABSTRACT

A light emitting device can include a sapphire substrate; a first conductivity type semiconductor layer disposed on the sapphire substrate; an active layer disposed on the first conductivity type semiconductor layer; a plurality of p-type conductors disposed on the active layer, and separated from each other; a first pad disposed on the first conductivity type semiconductor layer; and a second pad disposed on the plurality of p-type conductors, in which the plurality of p-type conductors are arranged in a first direction, the second pad is spaced apart from the first pad in a second direction, the second direction is perpendicular to the first direction, each of the plurality of p-type conductors has a first width in the first direction and a second width in the second direction, the first width being less than the second width, the plurality of p-type conductors are evenly spaced (Continued)

apart by a first distance in the first direction, and the first distance being less than the first width of each of the plurality of p-type conductors in the first direction.

19 Claims, 5 Drawing Sheets

(51) Int. Cl.
*H01L 33/40* (2010.01)
*H01L 33/08* (2010.01)

(52) U.S. Cl.
CPC .... *H01L 33/382* (2013.01); *H01L 2933/0016* (2013.01)

(58) Field of Classification Search
CPC ... H01L 33/08; H01L 33/36–46; H01L 33/62; H01L 33/48–648; H01L 2933/0033; H01L 2933/005; H01L 2933/0066–0091
USPC .......................................................... 257/98
See application file for complete search history.

(56) References Cited

U.S. PATENT DOCUMENTS

| | | | |
|---|---|---|---|
| 7,518,153 | B2 | 4/2009 | Usuda et al. |
| 7,589,351 | B2 | 9/2009 | Hsieh |
| 8,053,793 | B2 | 11/2011 | Park et al. |
| 8,106,415 | B2 | 1/2012 | Cheong |
| 8,450,751 | B2 | 5/2013 | Engl et al. |
| 8,680,564 | B2 | 3/2014 | Makino et al. |
| 8,835,954 | B2 | 9/2014 | Fujimoto et al. |
| 8,928,052 | B2 | 1/2015 | Engl et al. |
| 9,184,346 | B2 | 11/2015 | Lunev et al. |
| 10,014,442 | B2 * | 7/2018 | Kim .................... H01L 33/0093 |
| 10,134,956 | B2 | 11/2018 | You et al. |
| 2002/0063256 | A1 | 5/2002 | Lin |
| 2005/0002428 | A1 | 1/2005 | Kwak et al. |
| 2005/0051786 | A1 | 3/2005 | Okazaki et al. |
| 2005/0156185 | A1 | 7/2005 | Kim et al. |
| 2005/0184305 | A1 * | 8/2005 | Ueda ....................... H01L 33/08 257/99 |
| 2006/0033113 | A1 | 2/2006 | Lee et al. |
| 2006/0049417 | A1 | 3/2006 | Li et al. |
| 2006/0081869 | A1 | 4/2006 | Lu et al. |
| 2006/0208364 | A1 | 9/2006 | Wang et al. |
| 2007/0181889 | A1 | 8/2007 | Orita |
| 2008/0067497 | A1 | 3/2008 | Kim |
| 2008/0144688 | A1 * | 6/2008 | Chua ..................... H01L 33/405 372/50.1 |
| 2008/0157115 | A1 | 7/2008 | Chuang et al. |
| 2009/0090932 | A1 | 4/2009 | Bour et al. |
| 2010/0051995 | A1 | 3/2010 | Katsuno et al. |
| 2010/0320479 | A1 | 12/2010 | Minato et al. |
| 2011/0260184 | A1 | 10/2011 | Furuyama |
| 2012/0001196 | A1 | 1/2012 | Choi et al. |
| 2012/0161104 | A1 | 6/2012 | Okamoto et al. |
| 2012/0187442 | A1 | 7/2012 | Masaki et al. |
| 2012/0235204 | A1 | 9/2012 | Hodota et al. |
| 2012/0299038 | A1 * | 11/2012 | Hwang .................... H01L 33/32 257/98 |
| 2013/0119424 | A1 | 5/2013 | Kang et al. |
| 2013/0193464 | A1 | 8/2013 | Bae et al. |
| 2013/0221372 | A1 | 8/2013 | Lee et al. |
| 2013/0271707 | A1 | 10/2013 | Sakamoto et al. |
| 2013/0328013 | A1 * | 12/2013 | Inazu ...................... H01L 33/10 257/13 |
| 2014/0183546 | A1 * | 7/2014 | Kim ........................ H01L 33/38 257/76 |
| 2014/0327034 | A1 | 11/2014 | Toyota |
| 2015/0003053 | A1 | 1/2015 | Ariyoshi et al. |
| 2015/0034987 | A1 | 2/2015 | Hayashi et al. |
| 2015/0115300 | A1 | 4/2015 | Tomizawa et al. |
| 2015/0221826 | A1 | 8/2015 | Yang et al. |
| 2015/0228869 | A1 | 8/2015 | Yoo et al. |
| 2015/0263234 | A1 * | 9/2015 | Cho ....................... H01L 27/153 257/88 |
| 2016/0049551 | A1 | 2/2016 | Shatalov et al. |
| 2016/0064611 | A1 | 3/2016 | Choi et al. |
| 2016/0072004 | A1 | 3/2016 | Song et al. |
| 2016/0105940 | A1 | 4/2016 | Lee |
| 2016/0133788 | A1 | 5/2016 | Kim et al. |
| 2016/0218262 | A1 | 7/2016 | Aketa et al. |
| 2017/0121571 | A1 | 5/2017 | Namiki et al. |
| 2017/0263817 | A1 | 9/2017 | Hirano et al. |

FOREIGN PATENT DOCUMENTS

| | | |
|---|---|---|
| JP | 2012-248625 A | 12/2012 |
| JP | 2013-105917 A | 5/2013 |
| KR | 10-2006-0007893 A | 1/2006 |
| KR | 10-2013-0136128 A | 12/2013 |
| KR | 10-2014-0086624 A | 7/2014 |
| KR | 10-2015-0017543 A | 2/2015 |

OTHER PUBLICATIONS

The U.S. Office Action, dated Jan. 16, 2020, for U.S. Appl. No. 15/749,730 is attached.
Attached is the U.S. Office Action, dated Jun. 13, 2019, for U.S. Appl. No. 15/749,730.

* cited by examiner

LIGHT EMITTING ELEMENT HAVING EXCELLENT CONTACT BETWEEN SEMICONDUCTOR LAYER AND ELECTRODE

CROSS REFERENCE TO RELATED APPLICATIONS

This Application is a Continuation of U.S. patent application Ser. No. 15/749,730 filed on Feb. 1, 2018, which is the National Phase of PCT International Application No. PCT/KR2016/008325, filed on Jul. 29, 2016, which claims priority under 35 U.S.C. 119(a) to Patent Application No. 10-2015-0118801, filed in the Republic of Korea on Aug. 24, 2015, all of which are hereby expressly incorporated by reference into the present application.

TECHNICAL FIELD

Embodiments relate to a light-emitting element.

BACKGROUND ART

Group III-V compound semiconductors such as GaN and AlGaN are widely used for optoelectronics, electronic devices and the like, owing to many advantages such as, for example, a wide and easily adjustable band gap energy.

In particular, light-emitting elements such as light-emitting diodes or laser diodes using group III-V or II-VI compound semiconductors may realize various colors of light such as, for example, red, green, and blue light, as well as ultraviolet light, via the development of device materials and thin-film growth technique, and may also realize white light having high luminous efficacy via the use of a fluorescent material or by combining colors. These light-emitting elements have advantages of low power consumption, a semi-permanent lifespan, fast response speed, good safety, and eco-friendly properties compared to existing light sources such as, for example, fluorescent lamps and incandescent lamps.

Accordingly, the application of light-emitting elements has been expanded to a transmission module of an optical communication apparatus, a light-emitting diode backlight, which may substitute for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp. In recent years, light-emitting elements, which emit light within an ultraviolet wavelength range, have been used in various sterilization devices.

FIG. 1 is a view illustrating a light-emitting element of the related art.

In the light-emitting element 100 of the related art, a light-emitting structure 120, which includes a first conductive semiconductor layer 122, an active layer 124, and a second conductive semiconductor layer 126, may be formed on a substrate 110, a light-transmissive conductor layer 140 may be disposed on the light-emitting structure 120, a second electrode 166 may be disposed on the light-transmissive conductor layer 140, and a first electrode 162 may be disposed on the first conductive semiconductor layer 122.

The light-emitting element 100 emits light having energy determined by the inherent energy band of a constituent material of the active layer 124 in which electrons injected through the first conductive semiconductor layer 122 and holes injected through the second conductive semiconductor layer 126 meet each other. The light emitted from the active layer 124 may be changed depending on the composition of the constituent material of the active layer 124.

The light-transmissive conductor layer 140 is disposed in consideration of poor current injection from the second electrode 166 to the second conductive semiconductor layer 126. The light-transmissive conductor layer 140 is in tight contact with the second conductive semiconductor layer 126, and consequently, exhibits excellent current injection efficiency, but may absorb the light emitted from the active layer 124, which may cause deterioration in the luminous efficacy of the light-emitting element 100.

Technical Object

Embodiments are intended to improve current injection to a second conductive semiconductor layer in a light-emitting element, more particularly, a light-emitting diode, which emits light within an ultraviolet range, and to enhance the luminous efficacy thereof.

Technical Solution

One embodiment provides a light-emitting element including a light-emitting structure including a first conductive semiconductor layer, an active layer on the first conductive semiconductor layer, and a second conductive semiconductor layer on the active layer, a plurality of conductor layers selectively disposed on the second conductive semiconductor layer, and a reflective electrode disposed on the conductor layers and the second conductive semiconductor layer.

A portion of the first conductive semiconductor layer may be exposed by etching the second conductive semiconductor layer, the active layer, and a portion of the first conductive semiconductor layer, and a first electrode is disposed on the exposed first conductive semiconductor layer.

The first electrode may be disposed in a center area of the light-emitting structure.

The conductor layers may be disposed so as to surround the first electrode.

The reflective electrode may have an uneven structure due to the conductor layers.

The reflective electrode may have a flat surface.

The light-emitting element may further include a light-transmissive conductor layer disposed between the conductor layers and the reflective electrode or between the second conductive semiconductor layer and the reflective electrode.

Another embodiment provides a light-emitting element including a substrate, a light-emitting structure disposed on the substrate and including a first conductive semiconductor layer, an active layer on the first conductive semiconductor layer, and a second conductive semiconductor layer on the active layer, the first conductive semiconductor layer being exposed by etching the second conductive semiconductor layer, the active layer, and a portion of the first conductive semiconductor layer, a plurality of conductor layers selectively disposed on the second conductive semiconductor layer, a first electrode disposed on an exposed area of the first conductive semiconductor layer, and a second electrode disposed on the conductor layers and the second conductive semiconductor layer and having an uneven structure due to the conductor layers.

The second electrode may be a reflective electrode.

The second electrode may be composed of a light-transmissive conductor layer and a reflective electrode.

The conductor layers may have a polygonal or circular cross section.

Each of the conductor layers may have a width ranging from 20 μm to 400 μm.

The light-emitting structure may emit light within an ultraviolet range.

The first conductive semiconductor layer and the second conductive semiconductor layer may include AlGaN.

The conductor layers may include GaN.

The GaN may be doped with a second conductive dopant.

A further embodiment provides a light-emitting element including a light-emitting structure including a first conductive semiconductor layer, an active layer, and a second conductive semiconductor layer, a plurality of current-spreading layers selectively disposed on the second conductive semiconductor layer and formed of a material having an energy band gap smaller than that of the second conductive semiconductor layer, and a reflective electrode disposed on the second conductive semiconductor layer and the current-spreading layers.

The light-emitting element may further include a first electrode disposed on the first conductive semiconductor layer, and the first electrode may have a width equal to a width of each of the current-spreading layers.

Advantageous Effects

In a light-emitting element according to embodiments, a conductor layer, which is formed of GaN and doped with a p-type dopant, is selectively disposed on a second conductive semiconductor layer, whereby excellent contact between the second conductive semiconductor layer and a second electrode may be achieved, and the absorption of light within an ultraviolet range may be reduced owing to the composition of p-GaN, which may result in excellent luminous efficacy.

BEST MODE

Hereinafter, embodiments will be described in detail with reference to the accompanying drawings, in order to concretely realize the object described above.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "on/upper/above" and "beneath/lower/below", used in the following description may be used to distinguish any one substance or element with another substance or element without requiring or containing any physical or logical relationship or sequence between these substances or elements.

Figure 1:
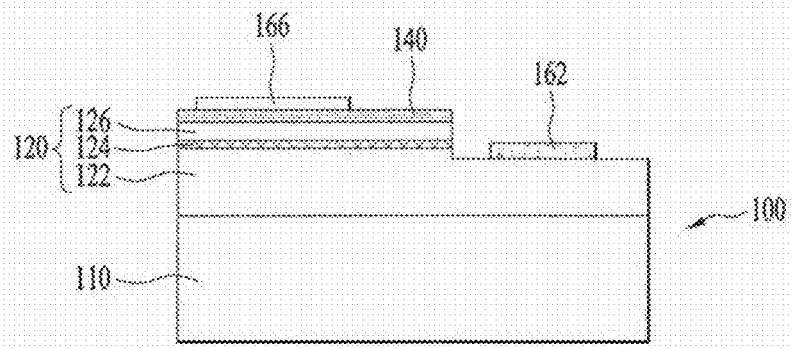
FIG. 1 is a view illustrating a light-emitting element of the related art.
Figure 2A:
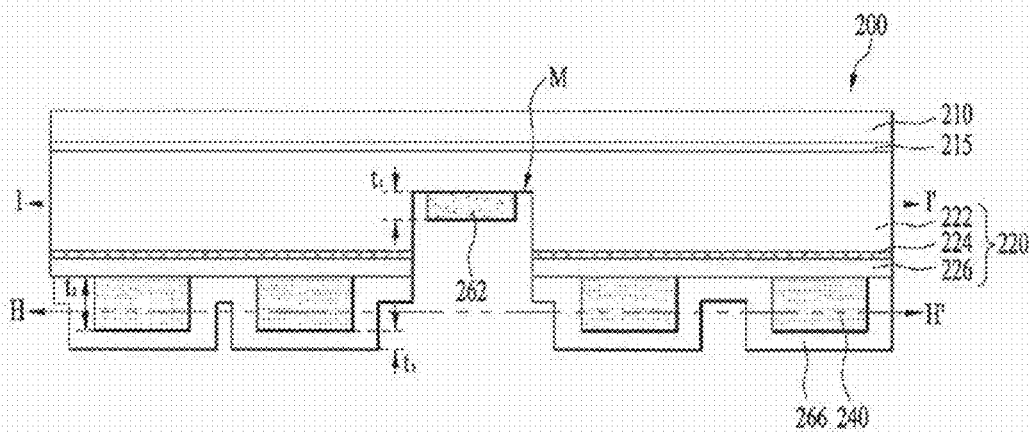
FIGS. 2a and 2b are views illustrating a first embodiment and a second embodiment of a light-emitting element.

FIG. 2a is a view illustrating a first embodiment of a light-emitting element.

In the light-emitting element 200 according to the embodiment, a light-emitting structure 220, which includes a first conductive semiconductor layer 222, an active layer 224, and a second conductive semiconductor layer 226, is disposed on a substrate 210, a plurality of conductor layers 240 is selectively disposed on the second conductive semiconductor layer 226, and a reflective electrode 266 is disposed on the second conductive semiconductor layer 226 so as to surround the conductor layers 240.

The substrate 210 may be formed of a material suitable for the growth of a semiconductor material, or a carrier wafer, or may be formed of a material having excellent thermal conductivity. The substrate may include a conductive substrate or an insulation substrate. For example, the substrate may be formed using at least one of sapphire ($Al_2O_3$), $SiO_2$, SiC, Si, GaAs, GaN, ZnO, GaP, InP, Ge, or $Ga_2O_3$.

Since the substrate 210 and the light-emitting structure 220 are formed of dissimilar materials, lattice mismatch therebetween is very great and the difference between thermal expansion coefficients therebetween is also very great, and therefore dislocation, melt-back, cracks, pits, surface morphology defects, or the like, which deteriorates crystallinity, may occur. For this reason, a buffer layer 215 may be formed between the substrate 210 and the light-emitting structure 220.

The first conductive semiconductor layer 222 may be formed of group III-V or II-VI compound semiconductors, or the like, and may be doped with a first conductive dopant.

The first conductive semiconductor layer 222 may be formed of a semiconductor material having a composition equation of $Al_xIn_yGa_{(1-x-y)}N$ ($0<=x<1$, $0<y<1$, $0<x+y<1$), and for example, may be formed of any one or more of AlGaN, GaN, InAlGaN, AlGaAs, GaP, GaAs, GaAsP, and AlGaInP.

When the first conductive semiconductor layer 222 is an n-type semiconductor layer, the first conductive dopant may include an n-type dopant such as Si, Ge, Sn, Se, or Te. The first conductive semiconductor layer 222 may be formed in a single layer or in multiple layers, without being limited thereto.

The active layer 224 may be disposed between the first conductive semiconductor layer 222 and the second conductive semiconductor layer 226, and may include any one of a single well structure, a multi-well structure, a single quantum well structure, a multi-quantum-well structure, a quantum dot structure, and a quantum line structure.

The active layer 224 may have any one or more pair structures of a well layer and a barrier layer using group III-V compound semiconductors, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto.

The well layer may be formed of a material, which has a smaller energy band gap than the energy band gap of the barrier layer. When the active layer 224 generates light of a deep ultraviolet (UV) wavelength, the active layer 224 may have a multi-quantum-well structure, and specifically, may have a multi-quantum-well structure in which a pair structure of a quantum barrier layer including $Al_xGa_{(1-x)}N$ (0<x<1) and a quantum well layer including $Al_yGa_{(1-y)}N$ (0<x<y<1) is one or more cycles, and may include a second conductive dopant, which will be described later.

The second conductive semiconductor layer 226 may be formed of a semiconductor compound. The second conductive semiconductor layer 226 may be formed of, for example, group III-V or II-VI compound semiconductors, and may be doped with a second conductive dopant. The second conductive semiconductor layer 226 may be formed of a semiconductor material having a composition equation of $In_xAl_yGa_{1-x-y}N$ (0<x<1, 0<y<1, 0<x+y<1), and may be formed of any one or more of AlGaN, GaN, AlInN, AlGaAs, GaP, GaAs, GaAsP, and AlGaInP. For example, the second conductive semiconductor layer 226 may be formed of $Al_xGa_{(1-x)}N$.

When the second conductive semiconductor layer 226 is a p-type semiconductor layer, the second conductive dopant may be a p-type dopant such as Mg, Zn, Ca, Sr or Ba. The second conductive semiconductor layer 226 may be formed in a single layer or in multiple layers, without being limited thereto.

Although not illustrated, an electron blocking layer may be disposed between the active layer 224 and the second conductive semiconductor layer 226. The electron blocking layer may have the structure of a super-lattice. For example, the super-lattice may be formed by disposing AlGaN doped with a second conductive dopant and alternately disposing a plurality of GaN layers having different composition rates of aluminum.

A portion of the first conductive semiconductor layer 222 may be exposed by mesa-etching the second conductive semiconductor layer 226, the active layer 224, and a portion of the first conductive semiconductor layer 222, and a first electrode 262 may be disposed on the exposed first conductive semiconductor layer 222.

The first electrode 262 may be formed in a single layer or in multiple layers using at least one of aluminum (Al), titanium (Ti), chrome (Cr), nickel (Ni), copper (Cu), or gold (Au).

The light-emitting structure 220 may particularly be formed of AlGaN and emit light within an ultraviolet wavelength range, more particularly, light within an UV-BE or UV-C range. Ultraviolet light may be divided into UVA, UVB and UVC depending on the wavelength band, UVA being ultraviolet light within a wavelength band from 320 nm to 400 nm, UVB being ultraviolet light within a wavelength band from 290 nm to 320 nm, and UVC being ultraviolet light within a wavelength band less than 290 nm.

Since the second conductive semiconductor layer 226 may have poor contact with the reflective electrode 266, which forms a second electrode, when the second conductive semiconductor layer 226 is formed of AlGaN, the conductor layers 240 may be disposed on the second conductive semiconductor layer 226.

The conductor layers 240 are in tight contact with the second conductive semiconductor layer 226 and advantageously exhibits a lower absorption rate of ultraviolet light, more particularly, UV-C. The conductor layers 240 may be formed using GaN doped with a p-type dopant, and p-GaN has a low absorption rate of UV-C.

Thus, in the present embodiment, the conductor layers 240 may be formed of p-GaN, and the conductor layers 240 may be selectively disposed on the second conductive semiconductor layer 226. When the conductor layers 240 are formed of GaN, the energy band gap of the conductor layers 240 may be less than the energy band gap of the second conductive semiconductor layer 226, which is formed of p-AlGaN, and the conductor layers 240 may serve as a current-spreading layer that uniformly transfers holes or current injected from the second electrode 266 to the second conductive semiconductor layer 226.

The reflective electrode 266, which is disposed on the conductor layers 240 and the second conductive semiconductor layer 226, may be formed of a material having high reflectance, and for example, may be formed of a metal, more particularly, formed in a single layer or in multiple layers using at least one of aluminum (Al), titanium (Ti), chrome (Cr), nickel (Ni), copper (Cu), or gold (Au).

In addition, a light-transmissive conductor layer (not illustrated) may be disposed between the reflective electrode 266 and the conductor layers 240 or between the reflective electrode 266 and the second conductive semiconductor layer 226. At this time, the light-transmissive conductor layer and the reflective electrode 266 may serve as a second electrode. The light-transmissive conductor layer may be formed of, for example, indium tin oxide (ITO).

Figure 2B:
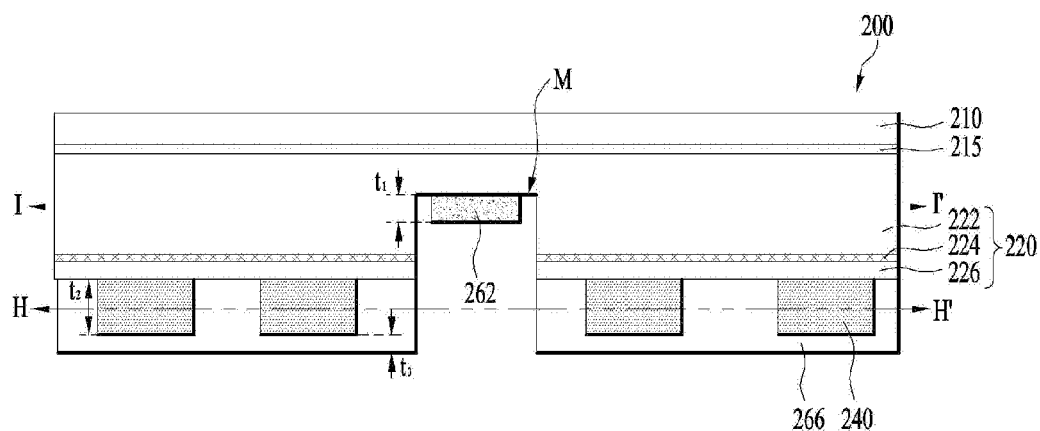

FIG. 2b is a view illustrating another embodiment of a light-emitting element. The light-emitting element of FIG. 2b is the same as the light-emitting element of FIG. 2a, with the exception that the reflective electrode 266 in FIG. 2a is disposed so as to surround the periphery of the conductor layers 240, has an uneven structure due to the conductor layers 240, and has a constant thickness t3, whereas, in the light-emitting element in FIG. 2b, the thickness t3 of the reflective electrode 266 is not constant and the lower surface of the reflective electrode 266 may be flat.

In FIGS. 2a and 2b, the thickness t1 of the first electrode 262 may range from a nanometer scale to a micrometer scale, and the thickness t2 of the conductor layers 240 may range from scores of nanometers to hundreds of nanometers.

Figure 3A:
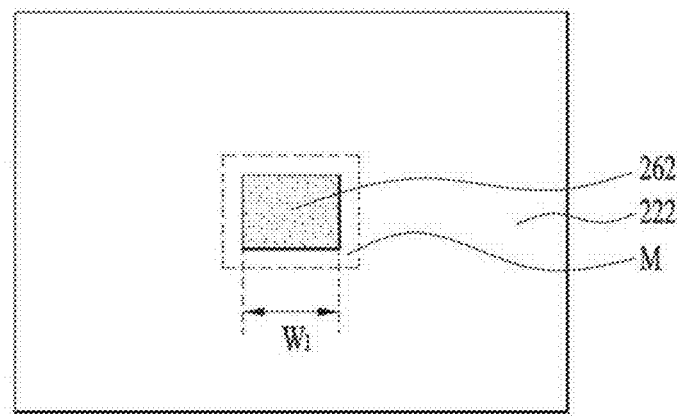
FIG. 3a is a cross-sectional view taken along direction I-I' of FIG. 2a, FIG. 3b is a cross-sectional view taken along direction H-H' of FIG. 2a, FIG. 4a is a view illustrating a third embodiment of a light-emitting element.
Figure 3A:
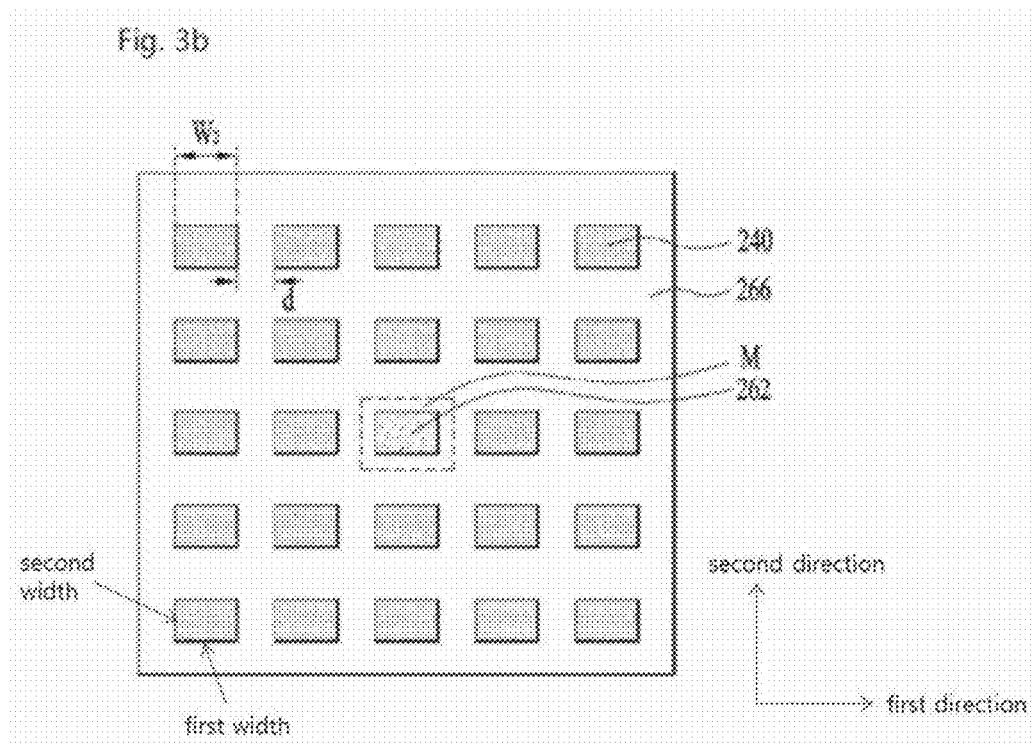

FIG. 3a is a cross-sectional view taken along direction I-I' of FIG. 2a, and FIG. 3b is a cross-sectional view taken along direction H-H' of FIG. 2a.

In FIG. 3a, a mesa area M may be disposed in the center of the first conductive semiconductor layer 222, and the first electrode 262 may be disposed in the mesa area M.

In FIG. 3b, the mesa area M may be disposed in the center, the first electrode 262 may be disposed in the mesa area M, and the plurality of conductor layers 240 may be disposed in a peripheral area. The conductor layers 240 may be disposed in a stripe form, rather than a cell shape as illustrated.

The width W2 of the first width of one conductor layer 240 may range from 201 μm to 400 μm. The conductor layer 240 may be deteriorated in contact characteristics when the width W2 thereof is below 20 μm, and may be increased in the absorption of light within an ultraviolet range when the width thereof is above 400 μm. In addition, the distance d between the conductor layers 240 may be equal to or less than the width W2 of the conductor layer 240, and may range from several micrometers to hundreds of micrometers.

In FIG. 3a, the width W1 of the first electrode 262 may be the same as the width W2 of the conductor layer 240.

Figure 2C:
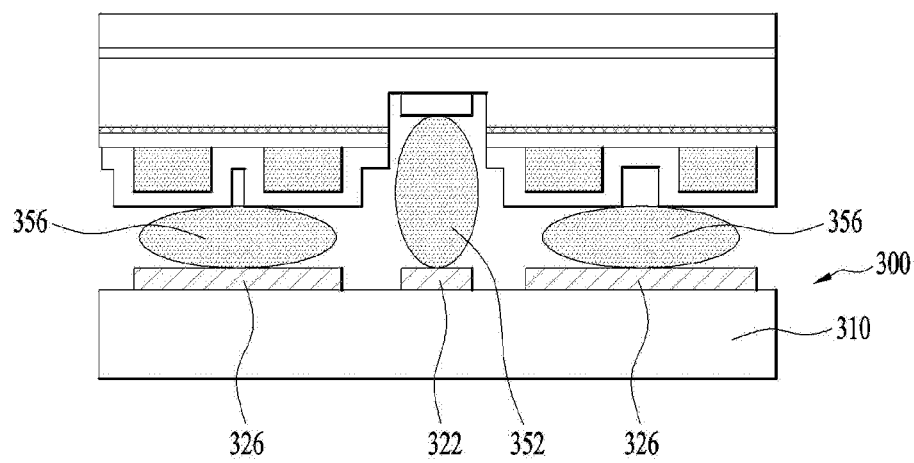
FIG. 2c is a view illustrating a light-emitting element package in which the light-emitting element of FIG. 2a is disposed.

FIG. 2c is a view illustrating a light-emitting element package in which the light-emitting element of FIG. 2a is disposed.

In FIG. 2c, the light-emitting element may be flip-chip-bonded to a substrate 310 via adhesive elements 352 and 356. A first conductor layer 322 and a second conductor layer 326 on the substrate 310 may be electrically connected respectively to the first electrode 262 and the reflective electrode 266, which is a second electrode, of the light-emitting element via the adhesive elements 352 and 356.

Figure 4A:
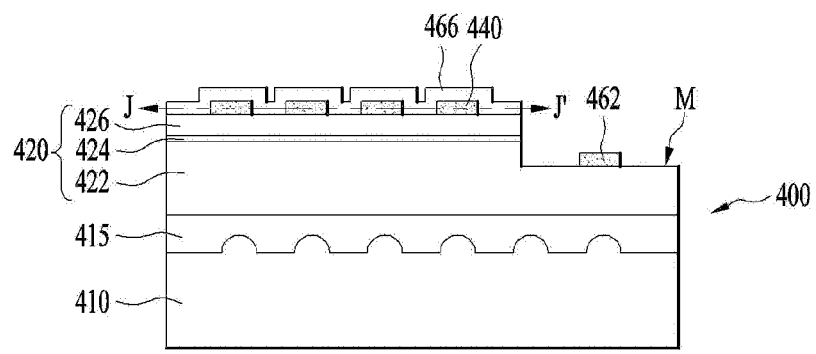
FIG. 4b is a cross-sectional view taken along direction J-J' of FIG. 4a, FIG. 5 is a view illustrating various shapes of a conductor layer.

FIG. 4*a* is a view illustrating a third embodiment of a light-emitting element.

In the light-emitting element 400 according to the embodiment, a light-emitting structure 420, which includes a first conductive semiconductor layer 422, an active layer 424, and a second conductive semiconductor layer 426, is disposed on a substrate 410, a plurality of conductor layers 440 is selectively disposed on the second conductive semiconductor layer 426, and a reflective electrode 466 is disposed on the second conductive semiconductor layer 426 so as to surround the conductor layers 440.

The configuration of the light-emitting element 400 according to the present embodiment is similar to that of the light-emitting elements of FIGS. 2*a* and 2*b*, but there is a difference in that mesa etching is not performed in the center of the light-emitting structure 420, but is performed in the edge of the light-emitting structure 420.

Figure 4B:
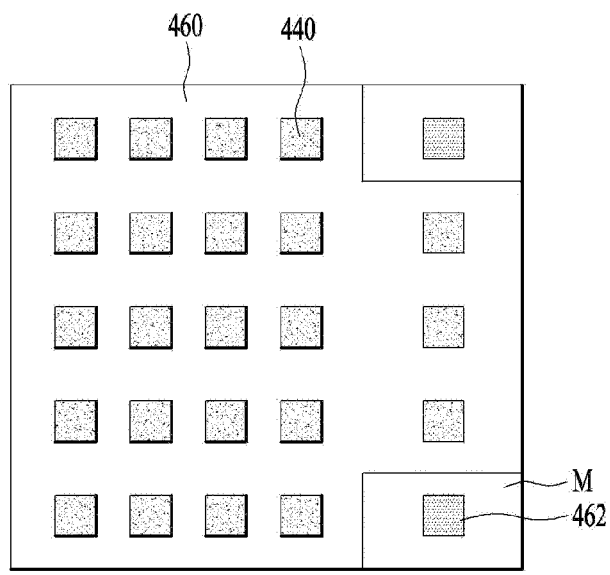

FIG. 4*b* is a cross-sectional view taken along direction J-J' of FIG. 4*a*.

In FIG. 4*b*, two mesa areas M may be disposed in the edge area, a first electrode 462 may be disposed in each mesa area M, and a plurality of conductor layers 440 may be disposed in the peripheral area. The conductor layers 440 may be disposed in a stripe form, rather than a cell shape as illustrated.

The width of the conductor layer 440, the distance between the conductor layers, and the like may be the same as those in the above-described embodiment.

Figure 5:
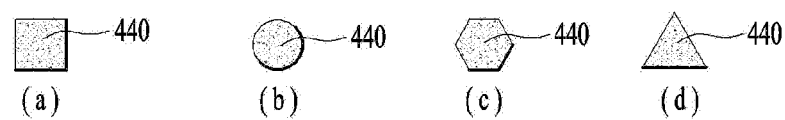

FIG. 5 is a view illustrating various shapes of the conductor layer.

The conductor layer 440 may have a cross section having a polygonal shape such as a circular shape (illustrated in (b)), a square shape (illustrated in (a)), a hexagonal shape (illustrated in (c)), a triangular shape (illustrated in (d)), or the like, which may be the same as in the embodiments described above.

In FIG. 2*c*, one light-emitting element is disposed in one light-emitting element package, but a light-emitting element package may be equipped with one light-emitting element or a plurality of light-emitting elements according to the embodiments described above, without being limited thereto.

The light-emitting element package described above may be used in a sterilization apparatus, or may be used as a light source of a lighting system. For example, the light-emitting element package may be used in an image display device and a lighting apparatus.

The light-emitting element described above may be disposed in a single line form on a circuit board so as to be used in a lighting apparatus, or may be used as an edge-type light source in an image display apparatus.

In addition, a plurality of light-emitting elements may be arranged in a plurality of rows and columns on the circuit board, and in particular, may be used as a vertical-type light source in an image display apparatus.

When the light-emitting elements described above are used as the light source of the image display apparatus or the lighting apparatus, the conductor layer, which is formed of GaN doped with a p-type dopant, may be selectively disposed on the second conductive semiconductor layer, which may ensure excellent contact between the second conductive semiconductor layer and the second electrode and may reduce the absorption of light within an ultraviolet range due to p-GaN, resulting in excellent luminous efficacy.

Figure 6:
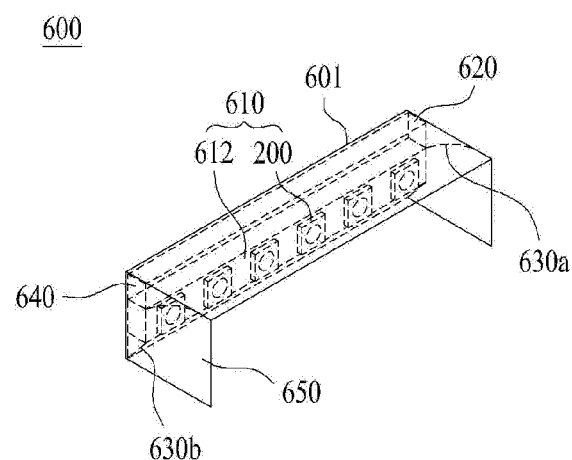
FIG. 6 is a view illustrating an embodiment of a sterilization device in which light-emitting elements are disposed.

FIG. 6 is a view illustrating an embodiment of a sterilization device in which light-emitting elements are disposed.

Referring to FIG. 6, the sterilization device 600 includes a light-emitting module unit 610 mounted on one surface of a housing 601, diffuse reflection members 630*a* and 630*b* configured to perform diffuse reflection of emitted light within a deep ultraviolet wavelength band, and a power supply unit 620 configured to supply available power required in the light-emitting module unit 610.

First, the housing 601 may have a rectangular shape, and may be formed in an integrated structure, i.e. in a compact structure such that all of the light-emitting module unit 610, the diffuse reflection members 630*a* and 630*b*, and the power supply unit 620 are mounted therein. In addition, the housing 601 may have a material and a shape to effectively dissipate heat generated inside the sterilization device 600 to the outside. For example, the housing 601 may be formed of any one material selected from among Al, Cu and an alloy thereof. Thus, the heat transfer efficiency of the housing 601 with outside air may be increased, and heat dissipation may be improved.

Alternatively, the housing 601 may have a unique external surface shape. For example, the housing 601 may have an external surface shape in which, for example, a corrugation, a mesh, or an unspecific uneven pattern protrudes therefrom. Thus, the efficiency of heat transfer between the housing 601 and outside air may be further increased, and heat dissipation may be improved.

Meanwhile, attachment plates 650 may further be disposed on opposite ends of the housing 601. The attachment plates 650 are members that function as brackets used to restrain and fix the housing 601 to a facility as illustrated. The attachment plates 650 may protrude from opposite ends of the housing 601 in a given direction. Here, the given direction may be the inward direction of the housing 601 in which deep ultraviolet light is emitted and diffuse reflection occurs.

Thus, the attachment plates 650, provided on opposite ends of the housing 601, may provide an area for fixing to a facility, thereby allowing the housing 601 to be more effectively fixed and installed.

The attachment plates 650 may take any one form selected from among a screwing member, a riveting member, an adhesive member, and a separable coupling member, and these various coupling members will be apparent to those skilled in the art, and thus a detailed description thereof will be omitted herein.

Meanwhile, the light-emitting module unit 610 is disposed so as to be mounted on one surface of the housing 601 described above. The light-emitting module unit 610 serves to emit deep ultraviolet light so as to kill airbone germs. To this end, the light-emitting module unit 610 includes a substrate 612 and a plurality of light-emitting element packages mounted on the substrate 612.

The substrate 612 may be disposed in a single row along the inner surface of the housing 601, and may be a PCB including a circuit pattern (not illustrated). However, the substrate 612 may include a general PCR, a metal-core PCB (MCPCB or metal core PCB), a flexible PCB, or the like, without being limited thereto.

Next, the diffuse reflection members 630*a* and 630*b* are members taking the form of reflectors configured to forcibly perform diffuse reflection of deep ultraviolet light emitted from the light-emitting module unit 610 described above. The diffuse reflection members 630*a* and 630*b* may have various overall surface shapes and arrangement shapes. By designing the diffuse reflection members 630*a* and 630*b* while slightly changing the planar shape structure (e.g. the radius of curvature) thereof, the strength of irradiation may be increased, or the width of light radiation region may be increased, as a result of deep ultraviolet rays that have been diffusely reflected being radiated so as to overlap each other.

The power supply unit 620 serves to receive power and supply available power required in the light-emitting module unit 610 described above. The power supply unit 620 may be disposed in the housing 601 described above.

As illustrated in FIG. 6, a power connector 640 may have a planar shape, but may take the form of a socket or a cable slot, which may be electrically connected to an external power cable (not illustrated). In addition, the power cable may have a flexible extension structure, and thus may be formed so as to be easily connected to an external power source.

Although embodiments have been described above, the above description is merely given by way of example and is not intended to limit the disclosure, and it will be apparent to those skilled in the art that various substitutions, modifications, and alterations may be devised within the spirit and scope of the embodiments. For example, the respective constituent elements described in the embodiments may be modified in various ways. In addition, differences associated with these modifications and alterations should be interpreted as being included in the scope of the disclosure defined by the accompanying claims.

INDUSTRIAL APPLICABILITY

A light-emitting element according to embodiments may reduce the absorption of light within an ultraviolet range due to p-GaN, thereby achieving excellent luminous efficacy.

The invention claimed is:

1. A light emitting device comprising:
   a sapphire substrate;
   a first conductivity type semiconductor layer disposed on the sapphire substrate;
   an active layer disposed on the first conductivity type semiconductor layer;
   a plurality of p-type conductors disposed on the active layer, and separated from each other;
   a first pad disposed on the first conductivity type semiconductor layer; and
   a second pad disposed on the plurality of p-type conductors,
   wherein the plurality of p-type conductors are arranged in a first direction,
   wherein the second pad is spaced apart from the first pad in a second direction,
   wherein the second direction is perpendicular to the first direction,
   wherein a top surface of each of the plurality of p-type conductors has a rectangular shape,
   wherein the rectangular shape of the top surface of each of the plurality of p-type conductors has a first width in the first direction and a second width in the second direction, the first width being larger than the second width,
   wherein the plurality of p-type conductors are evenly spaced apart by a distance in the first direction, the distance being less than the first width of the rectangular shape of the top surface of each of the plurality of p-type conductors in the first direction,
   wherein the second pad is electrically connected to each of the plurality of p-type conductors and fully covers the top surface of each of the plurality of p-type conductors,
   wherein a top surface area of the second pad is larger than a top surface area of the first pad, and
   wherein the first width of each p-type conductor is in a range of 20 μm to 400 μm.

2. The light emitting device of claim 1,
   wherein the first width of the rectangular shape of the top surface of each of the plurality of p-type conductors is equal to each other,
   wherein the second width of the rectangular shape of the top surface of each of the plurality of p-type conductors is equal each other, and
   wherein the second pad covers an entire area of the top surface of each of the plurality of p-type conductors.

3. The light emitting device of claim 1, wherein the second pad includes a plurality of concave portions and a plurality of convex portions.

4. The light emitting device of claim 3, wherein the plurality of convex portions of the second pad overlap with the plurality of p-type conductors, respectively.

5. The light emitting device of claim 3, wherein the active layer is configured to emit light having a highest intensity in a wavelength less than 290 nm.

6. The light emitting device of claim 1, wherein the first conductivity type semiconductor layer includes Si, and
   wherein each of the plurality of p-type conductors includes Mg.

7. The light emitting device of claim 6, further comprising:
   a second conductivity type semiconductor layer disposed between the plurality of p-type conductors and the active layer.

8. The light emitting device of claim 7, wherein the second conductivity type semiconductor layer includes $Al_xGa_{(1-x)}N$ and a Mg dopant, where $0<x<1$, and
   wherein the plurality of p-type conductors include p-GaN.

9. The light emitting device of claim 3, wherein each of the plurality of concave portions is disposed between two adjacent convex portions among the plurality of convex portions.

10. The light emitting device of claim 1, wherein the second width of each of the plurality of p-type conductors is equal to each other.

11. The light emitting device of claim 10, further comprising:
    a first adhesive member disposed on the first pad; and
    a second adhesive member disposed on the second pad,
    wherein the second adhesive member directly contacts the plurality of convex portions of the second pad.

12. A light emitting device package comprising:
    a sapphire substrate;
    a first conductivity type semiconductor layer disposed on the sapphire substrate;
    an active layer disposed on the first conductivity type semiconductor layer;
    a plurality of conductors disposed on the active layer, and separated from each other;
    a first pad disposed on the first conductivity type semiconductor layer; and
    a second pad disposed on the plurality of conductors,
    wherein the plurality of conductors are arranged in a first direction,
    wherein the second pad is spaced apart from the first pad in a second direction, wherein the second direction is perpendicular to the first direction, wherein the plurality of conductors include a plurality of top surfaces, respectively, each of the plurality of top surfaces having a rectangular shape, wherein each of the plurality of top surfaces of the plurality of conductors has a first width in the first direction and a second width in the second direction, the first width being larger than the second width, wherein the plurality of top surfaces of the plurality of conductors are evenly spaced apart from each other in the first direction by a distance, wherein the first width of each of the plurality of top surfaces of the plurality of conductors in the first direction is greater than the distance, wherein the second pad covers the plurality of top surfaces of the plurality of conductors entirely, and wherein the first width of each of the plurality of top surfaces is in a range of 20 μm to 400 μm.

13. The light emitting device package of claim 12, further comprising:

a second conductivity type semiconductor layer disposed between the plurality of conductors and the active layer, wherein the second conductivity type semiconductor layer includes $Al_xGa_{(1-x)}N$ and a Mg dopant, where $0<x<1$.

14. The light emitting device package of claim 12, further comprising:

a substrate;

wherein the first pad and second pad are disposed on the substrate, wherein a first conductive adhesive member is disposed between the first pad and the substrate, and wherein a second conductive adhesive member is disposed between the second pad and the substrate.

15. The light emitting device package of claim 14, wherein the second pad includes a plurality of concave portions and a plurality of convex portions, and wherein the second conductive adhesive member directly contacts the plurality of convex portions of the second pad.

16. The light emitting device package of claim 14, wherein the active layer is configured to emit light having a highest intensity in a wavelength less than 290 nm.

17. The light emitting device package of claim 12, wherein the second pad overlaps the rectangular shape of each of the plurality of top surfaces of the plurality of conductors, entirely.

18. The light emitting device package of claim 17, wherein the second width of each of the pluarlity of top surfaces of the plurality of conductors is equal to each other.

19. The light emitting device package of claim 18, wherein the first pad includes a width in the second direction, and wherein the width is in a range of 20 μm to 400 μm.

* * * * *